United States Patent [19]

Tsuji

[11] Patent Number: 5,606,204
[45] Date of Patent: Feb. 25, 1997

[54] RESIN-SEALED SEMICONDUCTOR DEVICE

[75] Inventor: Yukihiro Tsuji, Kumamoto, Japan

[73] Assignee: NEC Corporation, Tokyo, Japan

[21] Appl. No.: 493,427

[22] Filed: Jun. 22, 1995

[30] Foreign Application Priority Data

Jun. 23, 1994 [JP] Japan .................................. 6-141415

[51] Int. Cl.⁶ .......................... H01L 23/29; H01L 23/28;
H01L 23/053; H01L 23/14
[52] U.S. Cl. .......................... 257/793; 257/787; 257/701;
257/702; 257/792
[58] Field of Search ................................... 257/793, 672,
257/674, 787, 666, 686, 701, 702, 703,
705, 706, 792, 788

[56] References Cited

FOREIGN PATENT DOCUMENTS

| 60-117645 | 6/1985 | Japan ................................ 257/787 |
| 357236 | 3/1991 | Japan . |
| 4-146659 | 5/1992 | Japan ................................ 257/675 |
| 2086134 | 5/1982 | United Kingdom . |

Primary Examiner—Mahshid D. Saadat
Assistant Examiner—Jhihan B. Clark
Attorney, Agent, or Firm—Whitham, Curtis, Whitham & McGinn

[57] ABSTRACT

Disclosed is a resin-sealed semiconductor device which has an insulation substrate 1 having a chip-mounting portion is, leads which are radially disposed around the chip-mounting portion, an IC chip mounted on the chip-mounting portion and connected electrically with inner portions of the leads, a resin which seals over an area which includes the IC chip and the inner leads and does not include a peripheral portion of the insulation substrate and the outer leads, and outer portion of terminals which are electrically connected with the outer leads which are left out of the resin.

4 Claims, 6 Drawing Sheets

- 15 POSITIONING HOLE
- 14 SPROCKET HOLE
- 13 CUTTING PORTION
- 2 CHIP-MOUNTING PORTION
- 3b OUTER LEAD
- 3a INNER LEAD
- 1 INSULATION SUBSTRATE
- 12 RESIN INJECTION PORT
- 11 SLIT
- 3 LEAD
- 17 LEAD SUBSTRATE FRAME

- 2 CHIP-MOUNTING PORTION
- 3a INNER LEAD
- 3 LEAD
- 3b OUTER LEAD
- 11 SLIT
- 1 INSULATION SUBSTRATE
- 17 LEAD SUBSTRATE FRAME 5,606,204

RESIN-SEALED SEMICONDUCTOR DEVICE

FIELD OF THE INVENTION

This invention relates to a resin-sealed semiconductor device, and more particularly to a resin-sealed semiconductor device in which a defective can be found before a process of connecting an outer terminal to an outer lead.

BACKGROUND OF THE INVENTION

A conventional resin-sealed semiconductor device generally comprises an insulation substrate on which a chip-mounting portion is provided, leads which are radially disposed around the chip-mounting portion, an IC chip which is mounted on the chip-mounting portion, bonding wires which connect the inner leads of the leads to the electrode pads of the IC chip, outer terminals which are connected with outer leads, and a resin which seals up the IC chip and the bonding portion of the outer leads and the outer terminals. Due to the above structure, a short-circuit accident which is caused by the deformation of the lead when resin is injected to the lead substrate having the highly-integrated IC chip is prevented.

On the other hand, Japanese Patent Application Laid-Open No. 3-57236 discloses that the suspender of a tape automated bonding (TAB) device can be fixed to the island in the lead frame to enhance a mechanical strength and obtain a similar advantage.

However, the conventional resin-sealed semiconductor devices have problems as follows:

They are prepared by resin-sealing while the outer terminals of the lead frame are connected to the lead substrate or the outer leads of the TAB device, cutting the tie bars, plating, cutting the leads, and conducting the electrical test to select good devices. Therefore, they require many steps after resin-sealing even if a defect occurs in the steps of bonding and resin-sealing. These result in the waste of process and resources. Meanwhile, they may also require a re-molding of the outer terminals when the outer terminal is subjected to the deformation caused by the electric test and the like.

SUMMARY OF THE INVENTION

Accordingly, it is an object of the invention to provide a resin-sealed semiconductor device which is arranged so that a defect can be found before a process of connecting an outer terminal to an outer lead.

It is a further object of the invention to provide a resin-sealed semiconductor device which is arranged so that it can omit all processes after a process of connecting an outer terminal to an outer lead when a defect is found, thereby saving resources.

It is a still further object of the invention to provide a resin-sealed semiconductor device which is arranged to increase a heat radiating function and decrease the device thickness.

According to the invention, a resin-sealed semiconductor device, comprises:

an insulation substrate on which a chip-mounting portion is provided, leads which are disposed around the chip-mounting portion, each of the leads having an inner lead portion and an outer lead portion, an IC chip which is mounted on the chip-mounting portion and connected electrically with the inner lead portion of the leads, a resin which covers or seals over an area which includes the IC chip and the inner leads and does not include a fringe portion of the insulation substrate and the outer lead portions, and outer terminals which are electrically connected with the outer lead portions not covered by the resin.

BRIEF DESCRIPTION OF THE DRAWINGS

The invention will be explained in more detail in conjunction with the appended drawings, wherein.

DESCRIPTION OF THE PREFERRED EMBODIMENTS

Figure 1A:
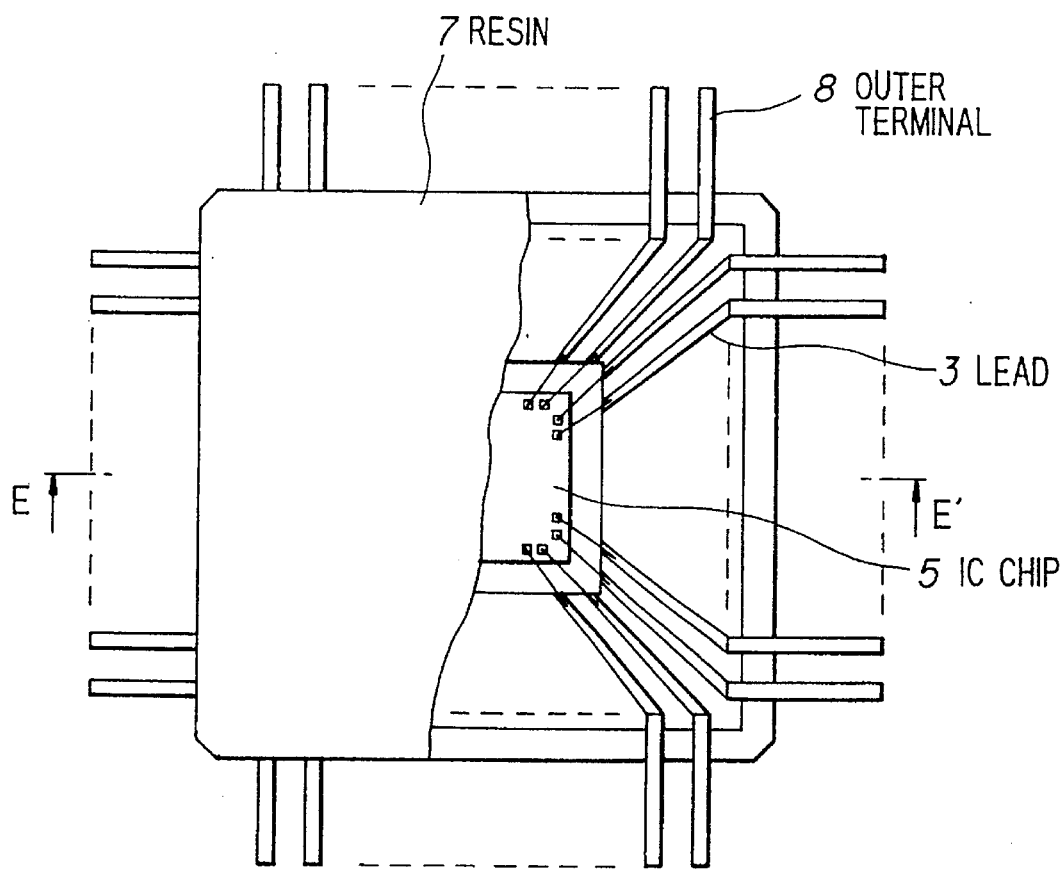
FIG. 1A is a front view showing a conventional resin-sealed semiconductor device.
Figure 1B:
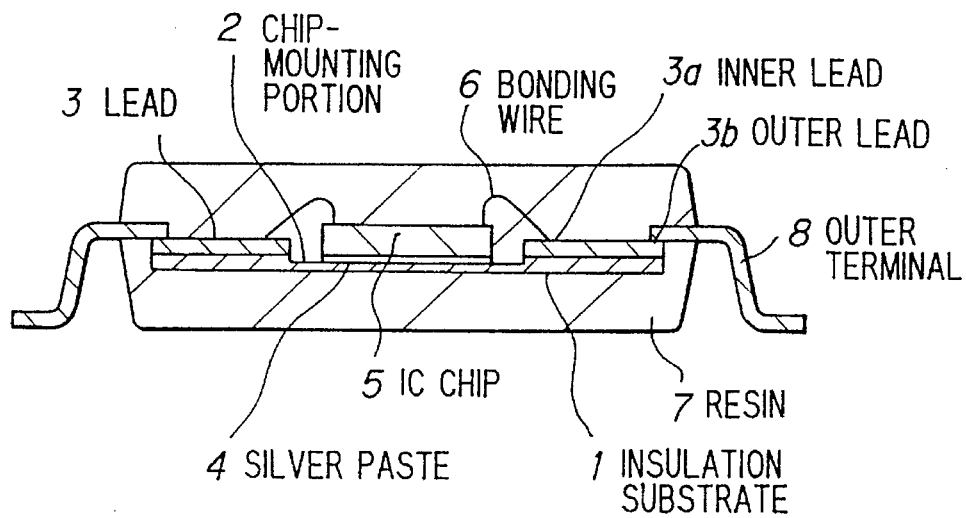
FIG. 1B is a cross sectional view cut along the line E-E' in FIG. 1B.

Before explaining a resin-sealed semiconductor device in the preferred embodiment, the aforementioned conventional resin-sealed semiconductor device will be explained in FIGS. 1A and 1B.

The conventional resin-sealed semiconductor device comprises an insulation substrate 1 on which a chip-mounting portion 2 is provided, leads 3 which are radially disposed around the chip-mounting portion 2, an IC chip 5 which is mounted on the chip-mounting portion, bonding wires 6 which connect the inner leads 3a of the leads 3 to the electrode pads of the IC chip 5, outer terminals 8 which are connected with outer leads 3a, and a resin 7 which seals up the IC chip 5 and the bonding portion of the outer leads 3a and the outer terminals 8. Namely, it is arranged so that both the outer leads and the outer terminals connected thereto are covered over or sealed over with resin. Therefore, as mentioned above, the conventional resin-sealed semiconductor device has a disadvantage that it requires unnecessary steps after resin-sealing even if a defect is found by the electrical test thereafter.

Next, the resin-sealed semiconductor device in the first preferred embodiment will be explained in FIGS. 2A and 2B, wherein like parts are indicated by like numerals as used in FIGS. 1A and 1B.

Figure 2A:
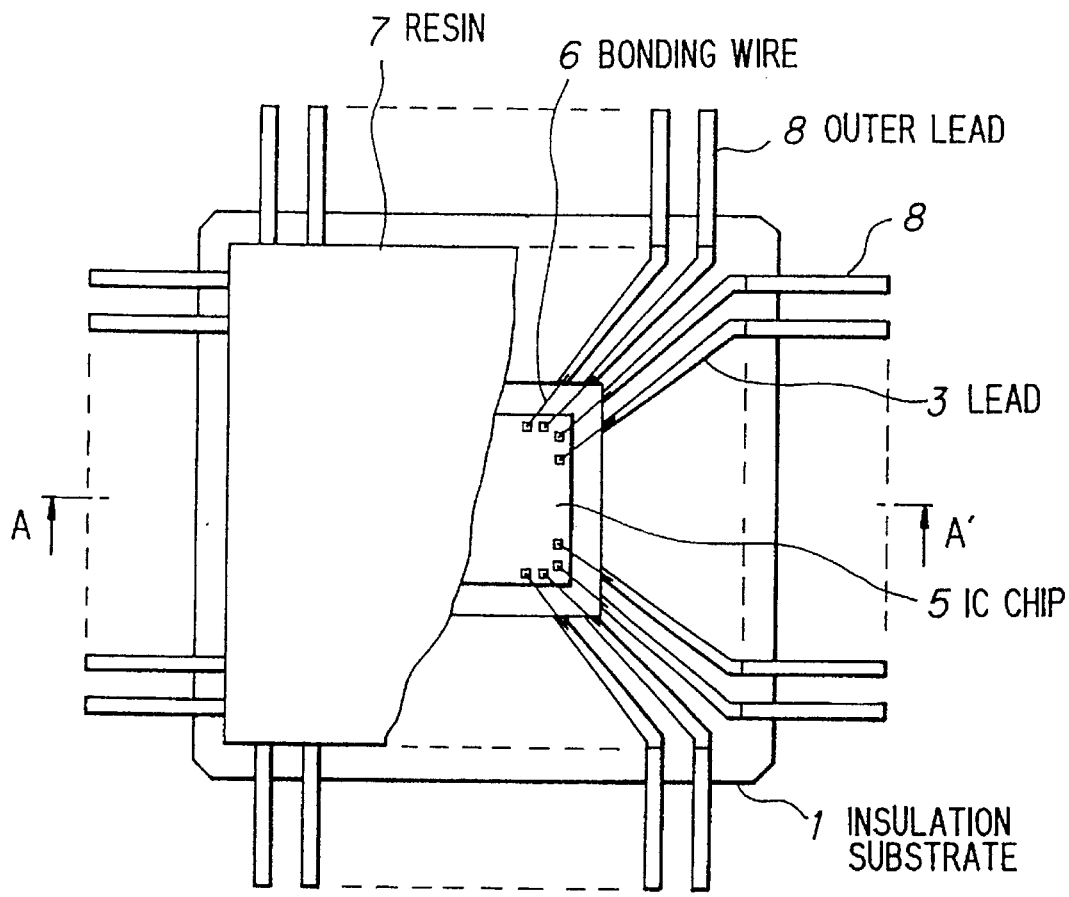
FIG. 2A is a front view showing a resin-sealed semiconductor device in a first preferred embodiment of the invention.
Figure 2B:
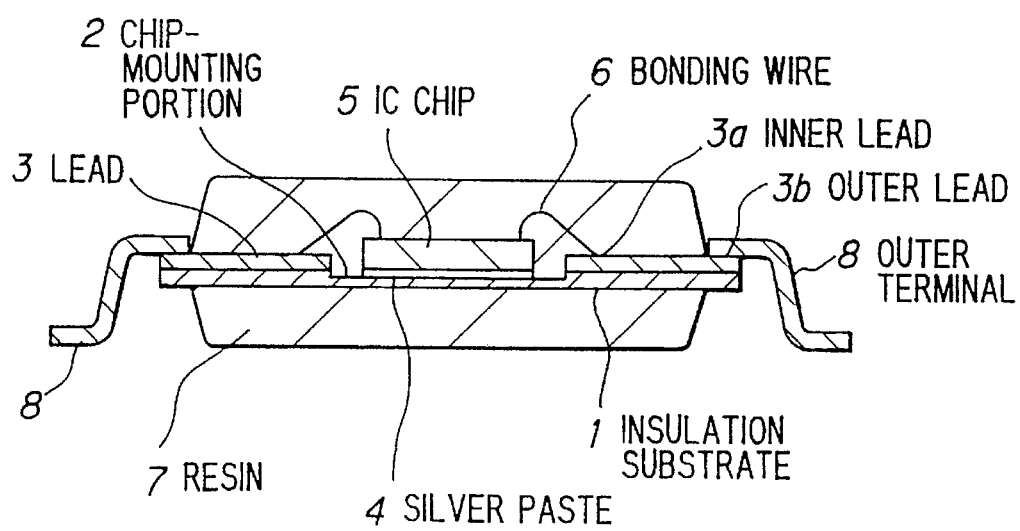
FIG. 2B is a cross sectional view cut along the line A-A' in FIG.2A.

As shown in FIGS. 2A and 2B, the resin-sealed semiconductor device of the invention in the first preferred embodiment comprises an insulation substrate 1, a chip-mounting portion 2 which is formed on the surface of the insulation substrate 1, leads 3 which are radially disposed around the chip-mounting portion 2 on the insulation substrate 1, an IC chip 5 which is attached on the chip-mounting porion 2 with silver paste 4 and is electrically connected to the inner lead portion 3a of the leads 3 by bonding wires 6, a resin 7 which seals over the area on the insulation substrate 1 including the IC chip 5 and the inner leads 3a except the fringe of the insulation substrate 1 and the outer lead portion 3b of the leads 3, and outer terminals 8 which are connected with the outer lead portions 3b not sealed over by the resin 7.

Figure 3A:
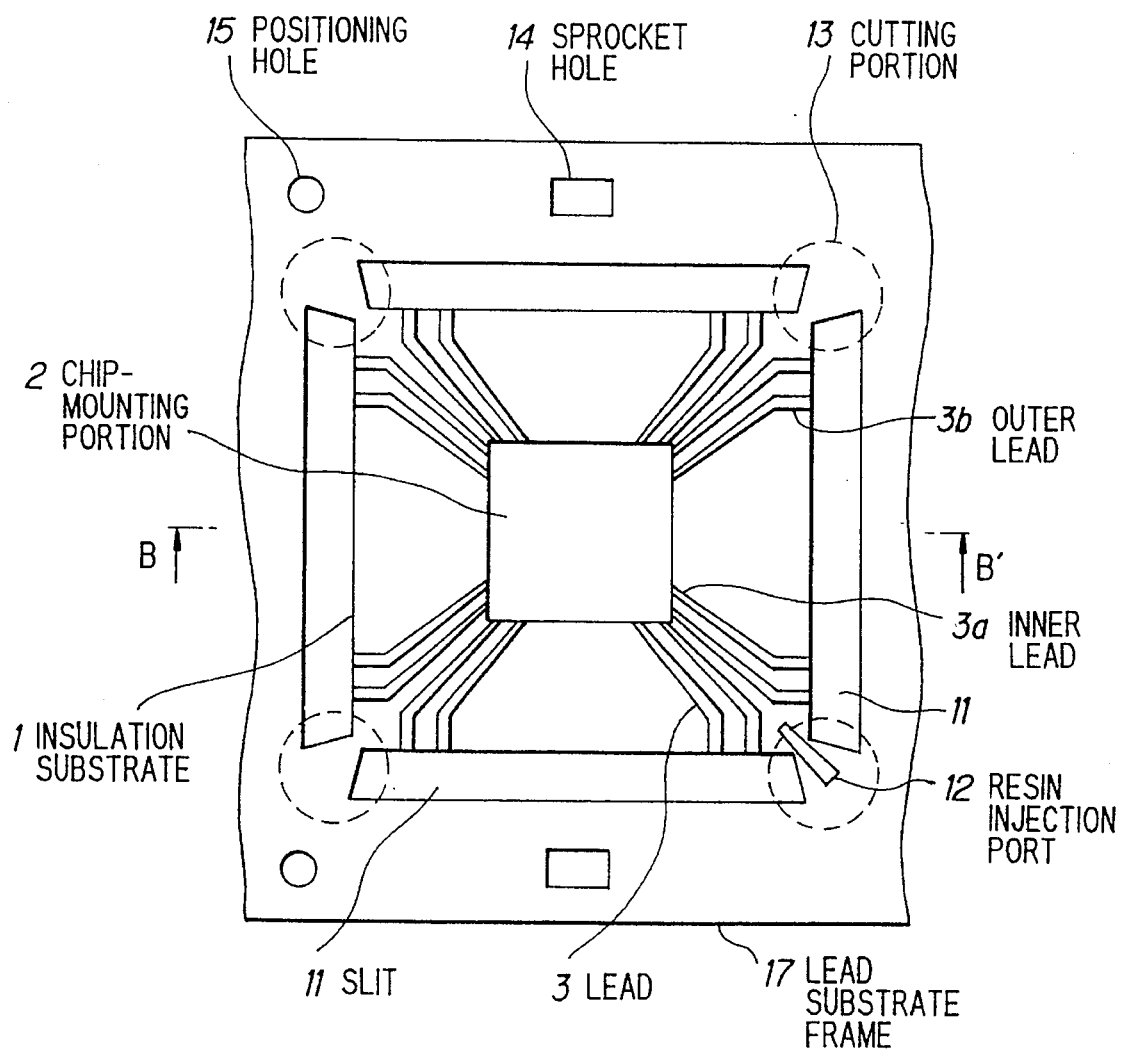
FIG. 3A is a front view showing a lead substrate frame provided for making the resin-sealed semiconductor device in FIGS. 2A and 2B.
Figure 3B:
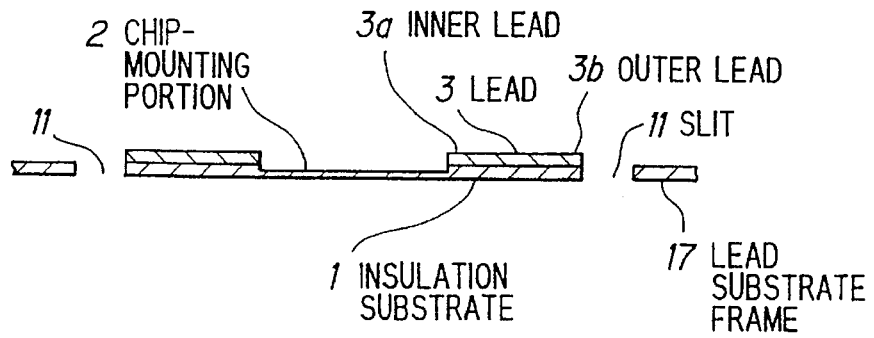
FIG. 3B is a cross sectional view cut along the line B-B' in FIG.3A.

Referring to FIGS. 3A and 3B, a lead substrate frame 17 is prepared by providing the chip-mounting portion 2 formed as a concave portion in the center of the insulation substrate 1 made of a glass-epoxy plate having a thickness of 0.1 to 0.5 μm or a polyimide resin film having a thickness of 0.1 to 0.3 μm, the leads 3 which are radially disposed around the chip-mounting portion 2, and slits 11 which are formed in the lead substrate frame 17 and are in contact with the edges of the outer lead portion 3b of the leads 3. Further, the lead substrate frame 17 has a resin injection port 12, and the portion of the lead substrate 1 can be separated from the remaining part of the lead substrate frame 17 when the cutting portions 13 which are positioned at the corners adjacent to the edges of the slits 12 as indicated by dotted circles in FIG. 3A are cut. Optionally, the lead substrate frame 17 may be provided with sprocket holes 14 and positioning holes 15.

Figure 4A:
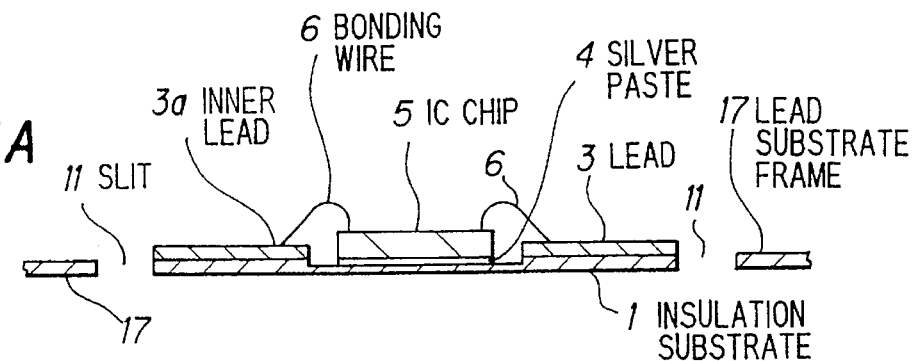
FIGS. 4A to 4D are cross sectional views showing the process for making the resin-sealed semiconductor device in FIGS. 2A and 2B.

FIGS. 4A to 4D show the process for making the resin-sealed semiconductor device of the invention in the first embodiment. In FIG. 4A, the IC chip 5 is adhered to the chip-mounting portion 2 of the insulation substrate 1 with silver paste 4. The electrode pad of the IC chip 5 is then connected to the inner leads 3 of the leads 3 with the bonding wires 6.

Figure 4B:
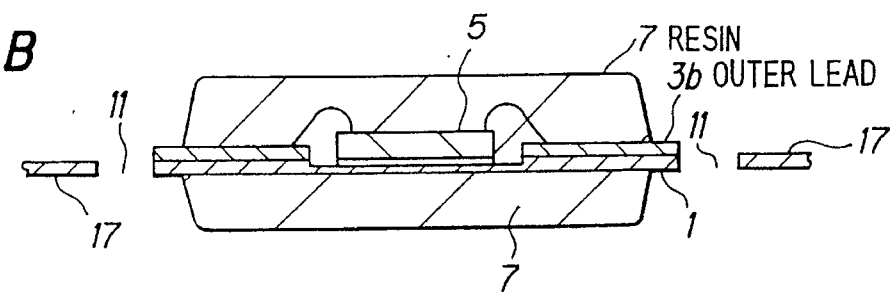

Next, as shown in FIG. 4B, the upper and lower surfaces of the lead substrate are sealed over with resin 7 only in an area which includes the IC chip 5 and inner leads 3a and does not include the fringe portion of the lead substrate 1 and the outer leads 3b.

Figure 4C:
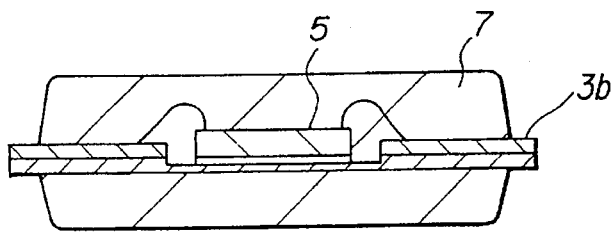

Then, as shown in FIG. 4C, the cutting portion 13 is cut down and the lead substrate is separated from the lead substrate frame 17 when the lead substrate 1 in its state of holding the frame 17 passes an electrical test.

Figure 4D:
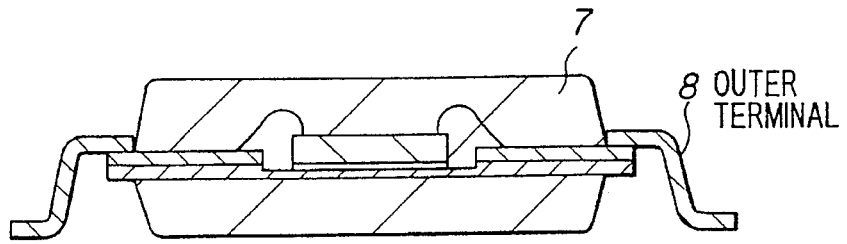
Figure 5A:
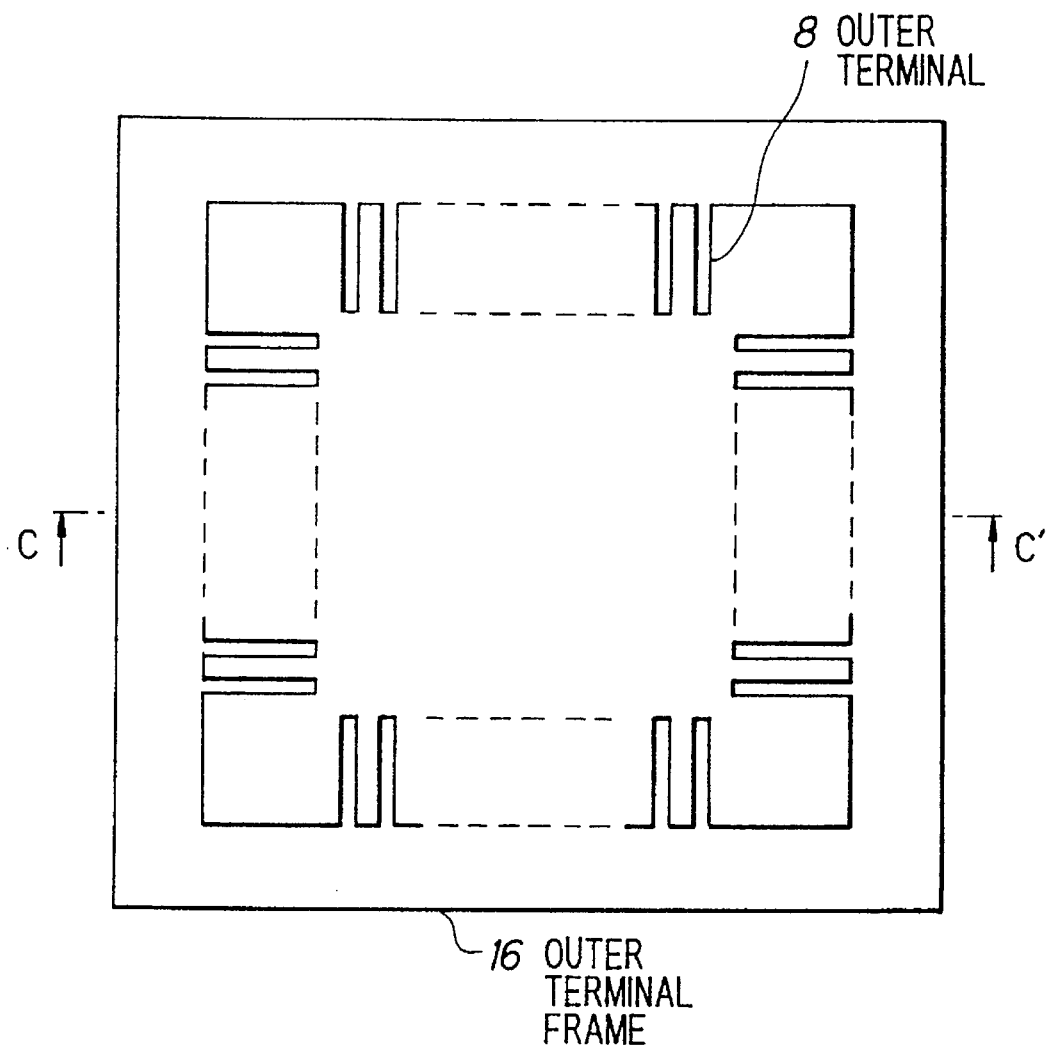
FIG. 5A is a front view showing an outer terminal frame provided for making the resin-sealed semiconductor device in FIGS. 2A and 2B.
Figure 5B:
FIG. 5B is a cross sectional view cut along the line C-C' in FIG. 5A.

Further, as shown in FIG. 4D, the outer terminals 8 which are made of 42 alloy or copper alloy or the like, and have a thickness of 0.1 to 0.3 μm and are solder-plated, are connected with solder to the outer leads 3b which are not sealed over by the resin 7 on the fringe portion of the insulation substrate 1. An outer terminal frame 16, inside of which the outer terminals 8 are provided as shown in FIGS. 5A and 5B, is prepared by stamping a metal plate and molding, the edges of the outer terminals 8 of the outer terminal frame 16 are positioned at the corresponding outer leads 3b to be connected thereto with solder, then the outer terminal frame 16 is separated to provide the resin-sealed semiconductor device.

Figure 6A:
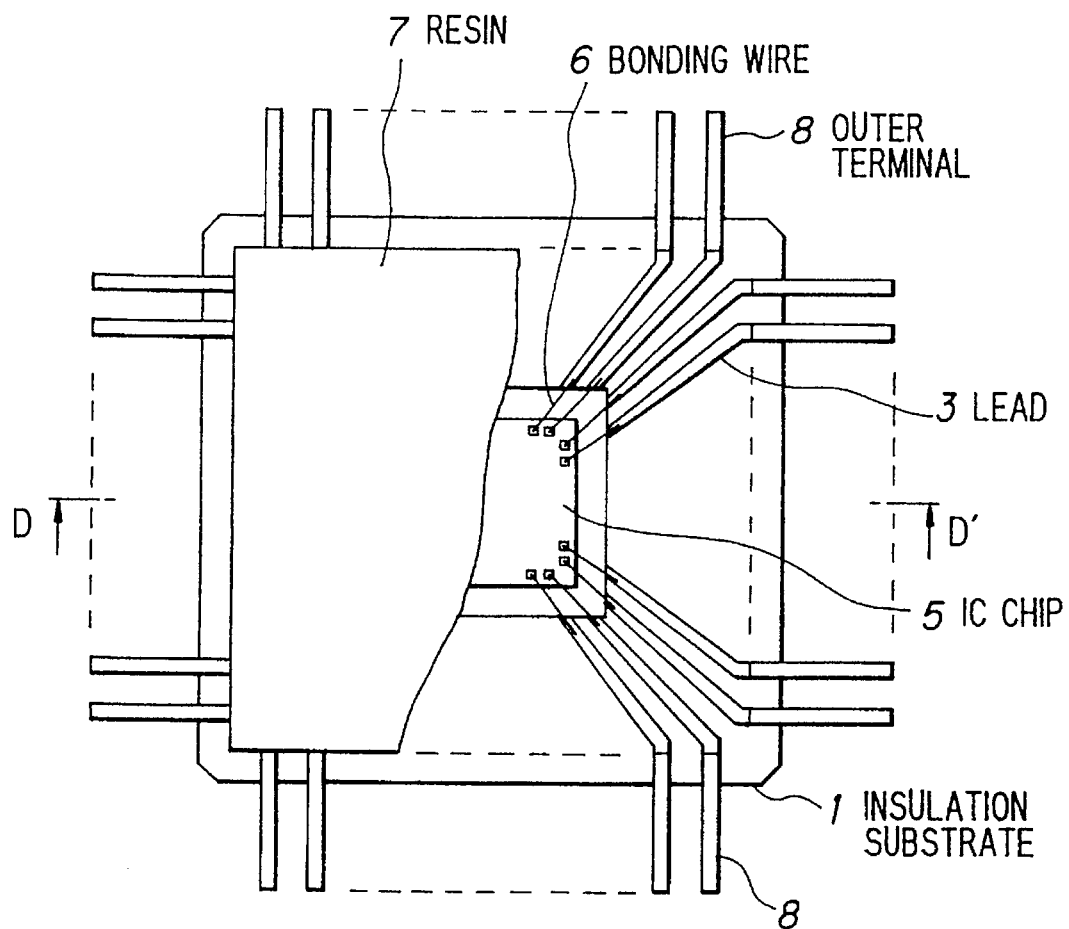
FIG. 6A is a front view showing a resin-sealed semiconductor device in a second preferred embodiment of the invention.
Figure 6B:
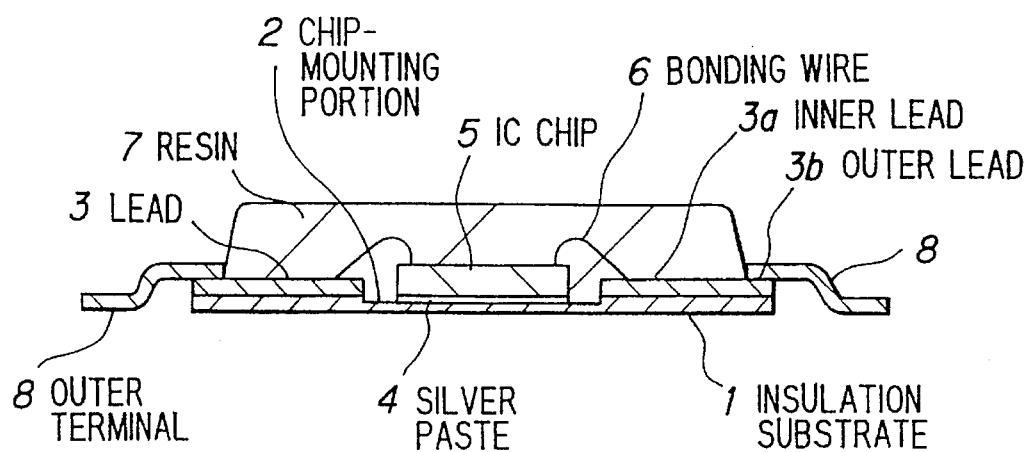
FIG. 6B is a cross sectional view cut along the line D-D' in FIG. 6A.

FIGS. 6A and 6B show the resin-sealed semiconductor device in the second preferred embodiment of the invention. As clearly shown in FIG. 6B, only the upper surface of the insulation substrate 1, which includes the IC chip 5 and the inner leads 3a and does not include the fringe portion of the insulation substrate 1 and the outer leads 3b disposed on the fringe portion, is sealed over with resin 7. The second embodiment has a similar structure to the first embodiment except that the lower surface of the insulation substrate 1 is exposed. It has an advantage of an increased heat radiating function and a decrease in the thickness of the semiconductor device.

As described above, the resin-sealing is carried out so that the fringe portion of the insulation substrate and the outer lead are left out of the sealing area, and the electrical test of the lead substrate is conducted through the outer lead, selecting only the insulation substrate which passed the test and connecting the outer terminal to the outer lead of the lead substrate. Accordingly, a defect can be found before the process of connecting the outer terminals to the outer leads, thereby the remaining processes after resin-sealing can be omitted and resources such as outer terminals can be saved.

Although the invention has been described with respect to specific embodiments for complete and clear disclosure, the appended claims are not to be thus limited, but are to be construed as embodying all modification and alternative constructions that may occur to one skilled in the art which fall within the basic teaching set forth herein.

What is claimed is:

1. A resin-sealed semiconductor device, comprising:

an insulation substrate having a chip mounting portion;

leads which are disposed on said substrate and extend from said chip-mounting portion, each of said leads having an inner portion proximal to said chip-mounting portion and extending to an outer portion distal from said chip-mounting portion;

an IC chip mounted on said chip-mounting portion and connected by electrical conductors with said inner portion of said leads;

a resin disposed on a top surface of said substrate to extend over said IC chip and said inner leads and devoid over a portion over a perimeter area of said insulation substrate and devoid over said outer portion of said leads;

a resin disposed on a bottom surface of said substrate to seal over an area thereon; and outer terminals which are connected to said outer portion of said leads at a location devoid of said resin.

2. A resin-sealed semiconductor device, according to claim 1, wherein:

said insulation substrate is made of a glass-epoxy resin.

3. A resin-sealed semiconductor device, according to claim 1, wherein:

said insulation substrate is made of a polyimide resin.

4. A resin-sealed semiconductor device according to claim 1 wherein said outer terminals are connected by a solder to said outer portion of a corresponding one of said terminals at a location devoid of said resin.

* * * * *